US006968614B2

(12) United States Patent
Lacroix et al.

(10) Patent No.: US 6,968,614 B2
(45) Date of Patent: Nov. 29, 2005

(54) METHOD FOR POSITIONING AN ELECTRONIC MODULE HAVING A CONTACT COLUMN ARRAY INTO A TEMPLATE

(75) Inventors: Yori Lacroix, Montreal (CA); Robert Langlois, Granby (CA)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 10/107,004

(22) Filed: Mar. 26, 2002

(65) Prior Publication Data

US 2002/0144399 A1 Oct. 10, 2002

(30) Foreign Application Priority Data

Apr. 8, 2001 (CA) .................................... 2343348

(51) Int. Cl.[7] ............................................. H01R 43/20

(52) U.S. Cl. ............................ 29/876; 29/884; 29/874; 324/761

(58) Field of Search .......................... 29/876, 832–838, 29/842, 884, 760, 853, 854; 324/758, 755, 324/761; 361/774, 777, 779; 228/180.21, 228/180.22

(56) References Cited

U.S. PATENT DOCUMENTS

| | | | | | |
|---|---|---|---|---|---|
| 5,015,946 | A | * | 5/1991 | Janko | 324/754 |
| 5,155,905 | A | * | 10/1992 | Miller, Jr. | 29/843 |
| 5,206,585 | A | * | 4/1993 | Chang et al. | 324/754 |
| 5,255,431 | A | * | 10/1993 | Burdick | 29/840 |
| 5,323,105 | A | * | 6/1994 | Davis et al. | 324/761 |
| 5,500,605 | A | | 3/1996 | Chang | |
| 5,796,590 | A | * | 8/1998 | Klein | 361/774 |
| 5,929,646 | A | | 7/1999 | Patel et al. | |

* cited by examiner

*Primary Examiner*—Minh Trinh
(74) *Attorney, Agent, or Firm*—Ira D. Blecker

(57) ABSTRACT

A method for positioning an electronic module having a plurality of interconnecting elements into a template. A first portion of the interconnecting elements are aligned with holes in the template and then the first portion of the interconnecting elements are partially inserted into the holes of the template. A second portion of the interconnecting elements are not inserted into the template at this time. Then, the second portion of the interconnecting elements are aligned with holes in the template and then inserted into the holes in the template. Lastly, the electronic module and template are urged together until the first and second portions of the interconnecting elements are fully inserted into the holes in the template. The interconnecting elements may then be tested.

8 Claims, 7 Drawing Sheets

METHOD FOR POSITIONING AN ELECTRONIC MODULE HAVING A CONTACT COLUMN ARRAY INTO A TEMPLATE

FIELD OF THE INVENTION

This invention generally relates to the handling of integrated circuit or electronic modules which comprise interconnecting elements. More specifically, the invention relates to a holder or template and method to hold such modules during processing and to test the elements and the interconnection of a grid array of elements attached to the electronic module.

BACKGROUND OF THE INVENTION

Ceramic column grid arrays, also known as contact column grid arrays, is an emerging technology for the packaging of integrated electronic components or modules. These contact column grid arrays are made of solder columns and are used to connect the electronic module to a card or circuit board. Since the solder columns in such arrays are typically made of solder alloy and are soft and fragile, the module with the attached columns must be handled with care or the columns could be damaged and bent out of alignment and result in ineffective electrical connections. This could entail expensive identification and replacement of the assembled damaged module.

Modern electronic device module designs comprise an insulative substrate having one or more integrated circuit chips and other devices on an upper surface and a grid matrix array of interconnecting terminals on a lower surface of the module providing for electrical contact to the chips. The terminals of the contact column grid array could be positioned over the entire lower surface of the module thus providing greater circuit density than other interconnecting arrangements, which typically require greater separation between the contact elements, or may be located only around the periphery of the module. Use of contact column grid array modules have been found to provide more beneficial results than other arrays such as ball grid arrays. As is typical in the electronic packaging industry, after the terminals or contacts have been assembled on the module they must be tested. This is done so as to identify any defective module connections before the module is ultimately assembled in a package to thereby eliminate the significant time and expense and possible damage to the module resulting from having to disassemble the module from the package.

As indicated, prior to permanently assembling the column grid array modules on to circuit boards or cards, there is a requirement and practice to electrically test each of the columns in the array. This is done by bringing test probes into contact with each of the columns. It is desirable to be able to carry out this testing automatically, efficiently and speedily without continuous activity from a human operator. The number of columns employed in arrays have increased significantly over time and could be in the order of 1,600 columns. Since the columns can readily become misaligned, bent or damaged, accurate subsequent test results for the module may not be obtained. The subject invention facilitates the handling of the contact column array modules in the aligning of the column interconnections and electrical testing of each column and the invention also provides useful and beneficial results in other applications.

A variety of configurations of solder connections have been used in circuit board assemblies and electronic card devices to provide electrical interconnections in order to electrically bond components together and to mount components carrying integrated circuit devices on modules for mounting on substrates, boards or cards. With the trend in electronic package and circuit assembly to higher functionality and complexity, there is a significant increase in the required number of electrical interconnections. While development continues to miniaturize interconnection size and pitch, the rate of increase in electronic module package complexity often occurs at such a rapid rate that package miniaturization cannot keep pace and therefore some package sizes must actually be increased. However, where device package sizes are decreased and the number of input/output leads typically increases, the size of the individual interconnections and the spacing between adjacent contacts must be reduced, resulting in potential difficulties in positioning and securing components on the surface of circuit boards, circuit cards and the like. In any event, in view of the expense of the various components and modules involved, there is a requirement to test each of the interconnection elements of the module before it is permanently assembled into a package and onto a card.

The testing of interconnecting elements has been known in the electronic packaging industry. One such example is described in U.S. Pat. No. 5,929,646 which issued Jul. 27, 1999 to International Business Machines Corporation, the disclosure of which is incorporated by reference herein, and is entitled "Interposer and Module Test Card Assembly". This patent describes an arrangement to facilitate the testing of semiconductor devices packaged in surface mount modules such as ball grid array or cylinder grid array modules, while the modules are connected to a system board. This arrangement allows chips to be tested without the need for the chip to be packaged in a specialized module for testing or for the creation of specialized system boards for testing. Included is a module test card which has a plurality of landing pads connected to a plurality of test pins on the upper surface thereof and also connected to a plurality of landing pads on the bottom of the module test card. The module test card is then interconnected with the circuit module and an interposer mechanism for connection to the system board thereby permitting testing of the assembly by means of the variety of test pins.

Another example of an arrangement for testing of interconnections of electronic circuitry is provided in U.S. Pat. No. 5,500,605 entitled "Electrical Test Apparatus and Method", the disclosure of which is incorporated by reference herein, which issued to AT&T Corporation on Mar. 19, 1996. The electronic devices to be tested are of the type having on one side an array of conductive projections such as solder balls. Spring loaded probes are provided in a similar arrangement which when activated, project through an array of apertures in an insulative template. The electronic device is forced against the template such that each contact projects into the aperture of the template in order to be contacted by the spring loaded conductive probes. Electrical testing can then be carried out by means of the probes.

In light of the known shortcomings with the prior art in the handling of integrated circuit modules having an array of interconnecting elements, of which the teachings of the above patent references are examples, an object of the present invention is to provide a self-aligning module template and method of use to ensure the interconnecting elements are properly positioned while maintaining their alignment.

A further object of the invention is to provide such a self-aligning module template and method to properly hold each module for a variety of activities including testing the interconnecting elements, storing the modules and transporting or shipping the modules.

A further object of this invention is to provide such a self-aligning module template and method which can be advantageously used with modules having a variety of interconnecting elements including those consisting of column grid arrays and pin arrays.

BRIEF SUMMARY OF THE INVENTION

There is thus a new requirement to be able to automatically align, hold and bring the columns of a column grid array module into contact with probe devices for testing of the columns and the module. To achieve this, a self-aligning module holder or template has been developed to ensure that the columns are properly aligned. A tester having a plurality of probes equal to the number of columns can be mounted below the template so that each of the probes is capable of contacting a respective column when the module is properly inserted into the template or holder.

According to one aspect of the invention, there is provided a template for use with an electronic module having an array of interconnecting elements, such that when the interconnecting elements are engaged with said template, said template holds and aligns the interconnecting elements. The template includes a top surface and a bottom surface. The template also has an array of holes extending from the top surface to the bottom surface of the template such that at least the same number of holes as the interconnecting elements in said array of interconnecting elements and said holes of said array of holes are positioned in the template corresponding to the positions of the interconnecting elements of said array of interconnecting elements, with each of the holes having an opening in the top and bottom surfaces. Then, at least some of the openings in the top surface are positioned at greater distances from the bottom surface than other openings in the top surface and at least some of other of the openings are positioned at a lesser distance from the bottom surface than other openings.

According to a second aspect of the invention, there is provided a method for positioning a plurality of interconnecting elements of an array of interconnecting elements of an electronic module into respective holes of a template, said template having a top surface and a bottom surface and having an array of holes extending from the top surface to the bottom surface of at least the same number of holes as the number of interconnecting elements of said array of interconnecting elements and said array of holes being correspondingly positioned as the interconnecting element array, each of said holes having an opening in said top and bottom surfaces, and at least some of said openings in a first portion of the top surface being positioned at greater distances from the bottom surface than other openings in the top surface and at least some of other of said openings in a second portion of the top surface being positioned at a lesser distance from the bottom surface than other openings. The method includes the steps of positioning the module so that the interconnecting elements corresponding to the holes in said first portion of the top surface are aligned with and are positioned over the holes of said first portion of the top surface, engaging said interconnecting elements corresponding to the holes in said first portion of the top surface with said holes in said first portion of the top surface so that said interconnecting elements enter the corresponding holes in the first portion of the top surface and other interconnecting elements are aligned with other holes of the template, and then urging the module towards the template such that interconnecting elements are pushed into holes in said first portion of the top surface of the template and other interconnecting elements enter and are pushed into holes located in the second portion of the top surface of the template such that each of the interconnecting elements of the module is engaged with and pushed into a corresponding hole in the template.

DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

BEST MODE FOR CARRYING OUT THE INVENTION

The present invention was created in order to overcome the inability of existing equipment to automatically handle the positioning and testing of contact column array modules. The invention was conceived so as to be able to make use of aspects of existing equipment for the handling and positioning of modules and for subsequent operations involving the module including testing of the contact column array on the modules. Machines for handling modules in general and probe mechanisms for testing the columns of the array are well known and do not form a part of the present invention and are well known to those skilled in this industry.

An operator of a module handler machine actually loads the modules to be tested into the module handler, monitors the operations of the handler as it moves and appropriately positions the modules, for example for testing, and the operator then removes the modules afterwards. No other operator involvement is normally required. The actual positioning of the modules and the aligning of the modules with the template will be subsequently described. The module handler per se is not new and a typical machine was acquired from Laurier Corporation in Manchester, N.H., U.S.A.

As has been previously described, it is required that in the electronics industry, each of the column leads of each of the modules be electrically tested to ensure that there are no defects in any one of the columns. The testing is carried out by bringing a test socket in contact with the end of each one of the columns in the modules, as is well known.

Since the columns of the modules are relatively pliable and can easily be bent out of alignment, it is a critical requirement that the columns be perfectly aligned prior to carrying out the testing. A new template or holder was developed for this purpose. However, it may be noted that the templates or holders to be subsequently described may also serve the practical purposes of acting as a holder or carrying device for physically holding and transporting contact column array modules. The modules in question consist of a substrate and on one side of which is an arrangement of one or more integrated circuit devices and other electronic components which are interconnected by means of conducting vias to a plurality of column leads aligned in an array on the opposite side of the substrate. These column leads, of course, are subsequently intended to mount and interconnect the electronic devices in a circuit board or card.

It should be appreciated and understood that the term "template" as used in this application, is intended to be a generic term and to encompass the meaning of a variety of other terms used in this electronic module assembly industry including jig, holder, tool, carrier or templet.

Figure 1:
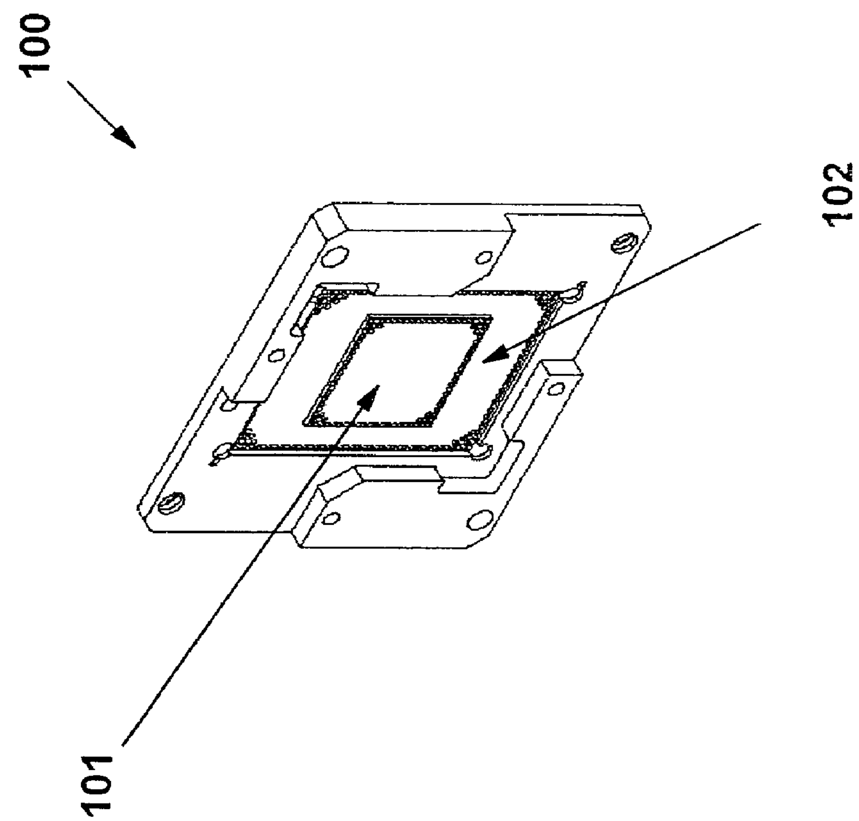
FIG. 1 is a perspective drawing of an example of the template according to the present invention.

The preferred embodiment for the inventive template of the subject application will now be described in more detail beginning with reference to FIG. 1 of the drawings which shows a perspective view of such a template. Template 100 includes a grid array of holes which correspond to the columns of a contact column grid array module. The template can be made of Vespel® SP-1 resin (a product of E.I. DuPont de Nemours, Wilmington, Del.), although other suitable insulative materials may be used for the template. The various holes can be formed by drilling or molding as would be well known in the industry. The array of holes correspond precisely to the positioning of the column grid array of the module and thus a different template would be required for each module having a different grid array. As can be seen from FIG. 1, the upper openings of the holes in the area of the centre of the template 101 are at a higher level of the template than the array of holes towards the outside of the template as shown at 102. In other words, the hole openings in the template form two tiers or levels 101 and 102. Not shown in FIG. 1 is the fact that once the columns of a module are appropriately positioned and fully inserted into the holes of the template the columns are uniformly accessible on the lower side or underside of the template which is essentially a flat surface. This arrangement provides convenient access to each column of the array of columns at the underside of the template for testing purposes or any other purpose as needed.

Figure 2:
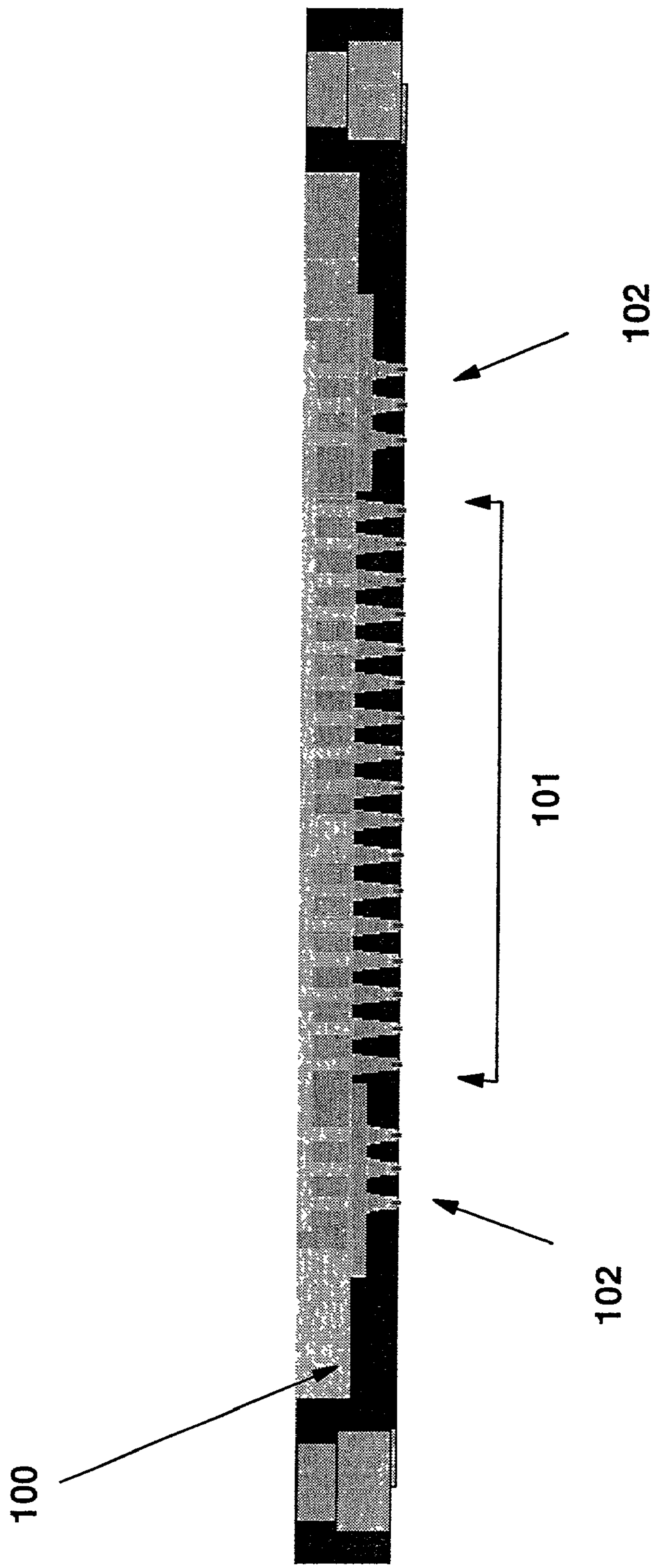
FIG. 2 is a pictorial cross-sectional side view of the template of FIG. 1.

FIG. 2 of the drawings is a pictorial cross-sectional view of the template shown in FIG. 1. It can readily be seen from FIG. 2 the two levels of hole openings 101 and 102 in the top surface of template 100 and the uniform level of the hole openings in the bottom surface of the template. The two levels of hole openings 101 and 102 can be thought of as two upper surfaces of the module, each having holes therein and each at a different level.

Figure 4:
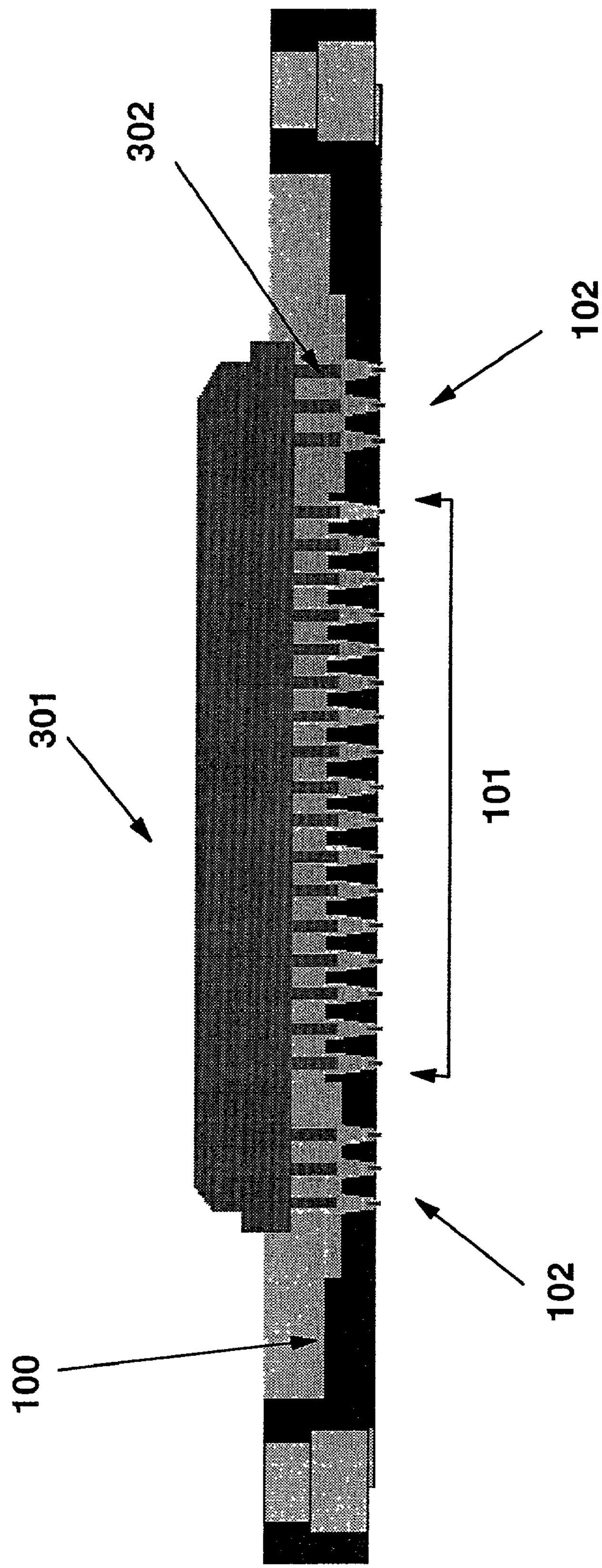
FIG. 4 is another pictorial cross-sectional view of the module and template showing the columns of the module initially inserted into the higher level holes of the template.
Figure 5:
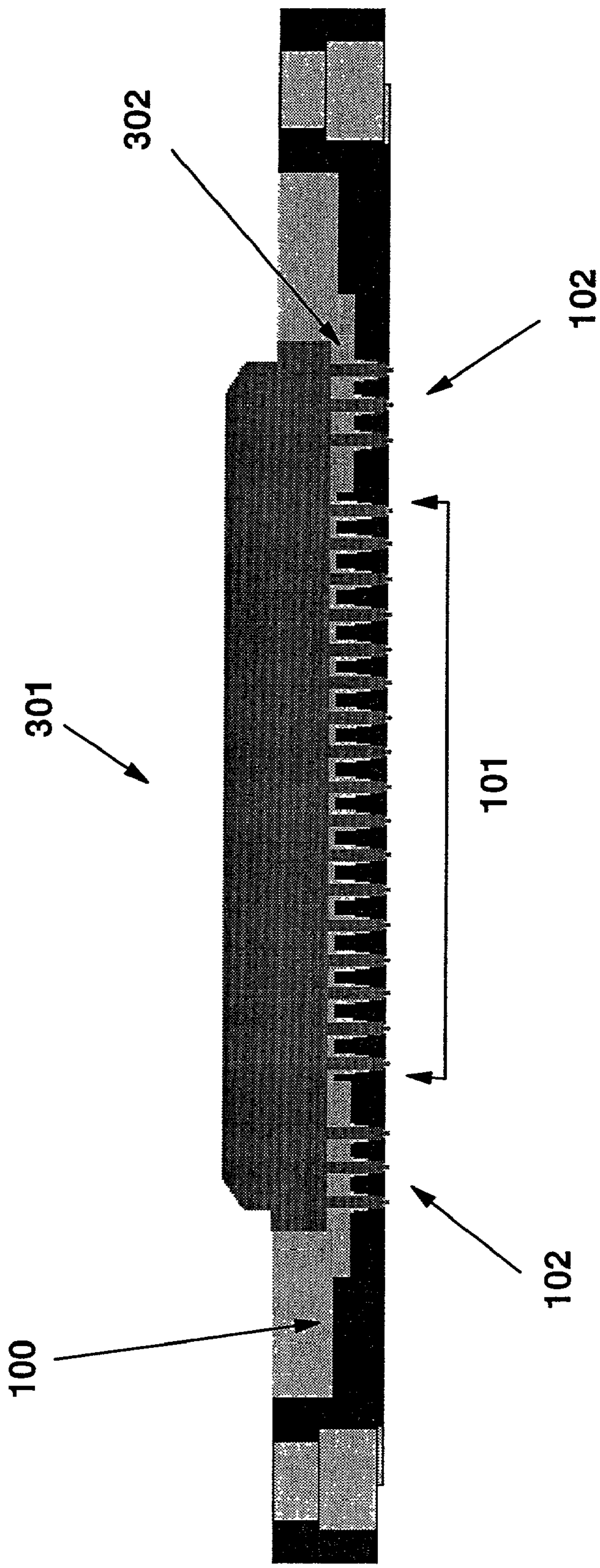
FIG. 5 is a pictorial cross-sectional view of a module and template showing the columns fully engaged into the holes of the template at both levels.

The automatic and self-alignment of the columns of the module as they are inserted into the holes of the template will now be illustrated and described with reference to FIGS. 3, 4 and 5 of the drawings. In each of these Figures, reference numerals 100, 101 and 102 respectively represent the template, the holes formed in the higher level of the top surface of the template, and the holes formed in the lower level of the top surface of the template as had been previously described and shown with reference to FIGS. 1 and 2. These are the same reference numerals as appear in FIGS. 1 and 2. In each of FIGS. 3, 4 and 5, component module 301 is shown having an array 302 of contact columns.

Figure 3:
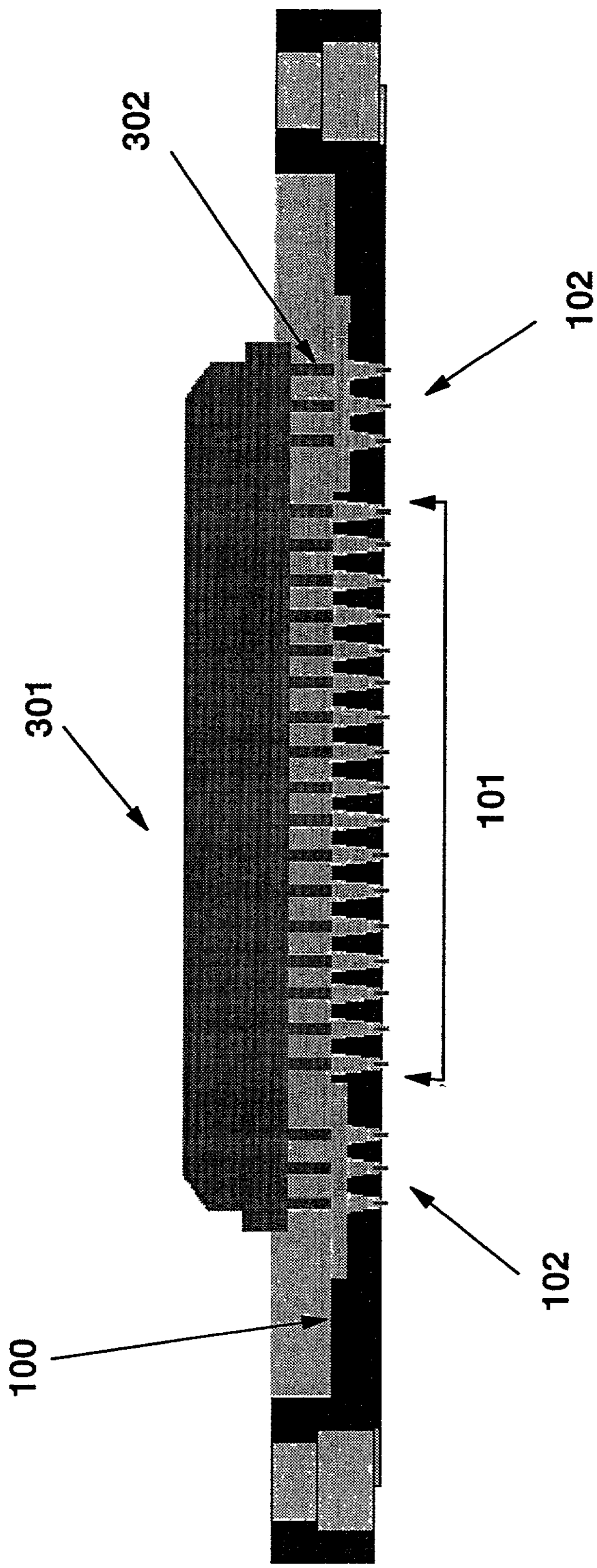
FIG. 3 is a pictorial cross-sectional view of the template of FIG. 1 showing a module positioned above the template.

Initially with reference to FIG. 3, it can be seen that the holes and the hole openings 101 in the higher level or upper surface of the template are located in the central area of the grid array. The columns 302 in the centre area of the column grid array of the module 301 that correspond to these central holes 101 are first aligned with these holes 101 located in the centre area of the top surface of the template. As the initial columns are inserted into the holes 101 the module is pushed towards the template and the columns 302 are further engaged into the holes 101. As shown in FIG. 4, the first or upper level holes 101 correct the angle of rotation of the module 301 with the columns 302 located in these holes in the centre area of the template before the insertion of any columns into the second or lower level of holes 102. FIG. 4 shows the first columns 302 being initially engaged into the upper level holes 101. Once these columns are properly inserted into the holes 101, then it follows that the outer columns 302 of module 301 as shown will be properly aligned and will be properly inserted into the corresponding outer holes 102 of the holder as the module is automatically pushed further into the template 100. Thus, when the outside columns 302 reach the second level or surface of holes 102, they will already be properly aligned with the corresponding holes 102.

Of course, if the columns 302 were not properly aligned with the outside lower level holes 102 of template 100, they would abut or contact the surfaces of the template between the holes and could thereby be damaged and become non-aligned which may then result in the module being not usable. At the very least such columns would not result in a positive test subsequently. It is apparent that the further the columns 302 are from the physical centre of the module 301, the larger will be the benefitted rotation effect between module 301 and the grid holes of template 100 as the central columns are being properly engaged in the corresponding holes 101. It thus follows that columns 302 located towards the outside of the array of columns of module 301 will become more offset with the aligning action than the columns in the centre of module 301. This results in the template automatically correcting any misalignment of module columns 302 before the columns are mechanically completely inserted into all of the holes in the grid of holes in the template 100. FIG. 5 illustrates the columns 302 of the module 301 have been fully automatically inserted into all of the holes 101 and 102 of the template 100. It is also apparent from FIG. 5 that all of the columns 302 of module 301 are at the same level with respect to the bottom surface of template 100 so that all of the columns are readily accessible by means of test probes through the bottom of the holes 101 and 102, irrespective of the level of the hole opening in the upper surface of the template 100.

From the above it can be seen that template 100 provides for the automatic self-alignment of all of the columns 302 of module 301 into the respective holes of template 100 in such a manner that they are now effectively positioned for a testing application. The probes of the tester can then properly contact the ends of all of the columns 302 from below the template 100.

From the above description it is apparent that having the opening of the upper holes in the template 100 at more than two levels may provide a further benefit in ensuring that the module is automatically properly rotated and oriented in stages as it is mechanically applied to template 100 and all of the columns 302 of the module are properly inserted into the holes of template 100. Thus, additional levels of the upper openings of the holes is contemplated. The invention is not limited to the number of columns on a module and thus the number of holes in the template. These may vary to accommodate any size of module and any number of module columns. It is also apparent that the invention is not limited to a particular number of openings of the holes in the higher level on the top surface of the template but the grouping of the number of holes in the higher level and lower level of openings may readily be varied from what has been shown and described.

The contact column grid array modules are positioned and cycled through a module handier in the test area essentially automatically or electro mechanically with various sets of pusher and stepping motors and without the requirement for continuous operator involvement. The operator simply loads and unloads the modules after the testing operation and monitors the operations. Any feedback or sensing activities of the modules and their movements that are normally used and well known in the industry for the automatic positioning of the modules could be used.

As is now apparent, the pre-alignment of the columns of a column grid array module with the holes in the template occurs since once the centrally positioned columns enter the first upper level of holes, inappropriate rotation of the module is prevented before the columns towards the outside of the module begin to enter the next lower level of openings of holes in the template, thus preventing any mechanical damage to the columns and at the same time assuring the columns will be properly positioned for good electrical contact with the testing probes. As is also apparent, the diameter of each column of the grid array is uniformly the same and the diameter of each hole in the array of holes in the template is essentially the same as the diameter of a column in order that the columns are adequately received and accommodated into the holes of the template.

The multi-level grid template allows for automated handling of the modules at the test operation. Since there is no need for a visual inspection system to ensure the proper positioning of the columns of the module for testing, this results in more efficient throughput of the modules within the testing operation and a more efficient use of expensive equipment.

In view of the sensitivity to damage of the pliable contact columns of a contact column grid array, there are a variety of other uses for the template. Use in testing column arrays is the preferred embodiment described for the template, however the template could serve as a shipping or storage container for the modules once the modules have been properly positioned into the template.

If the template forming the disclosed invention is to be used as a shipping or storage container for protecting the modules and the column grid arrays, there is no need for the holes to be through the bottom of the template. For this application there may be no need to have access to the columns through open holes in the bottom of the template. All that is required would be for the holes in the template to be deep enough for the columns to be adequately seated and accommodated. Thus the bottom of the template could be conveniently covered in any appropriate manner as by a plate made of similar material as the template or formed as part of the template.

Although the described preferred embodiment pertains to use of the template with modules having column grid arrays, the template can be readily used to handle and protect packages having any interconnecting elements constituting pins. The columns described could be thought of as a special type of pin connections in that they are made of solder material and are soft and pliable, but the handling of modules having any metallic pin connecting elements having any other physical characteristics could benefit from use of the subject template. In this context, the terms "columns" or "pins" could be considered substantially equivalent.

Figure 7:
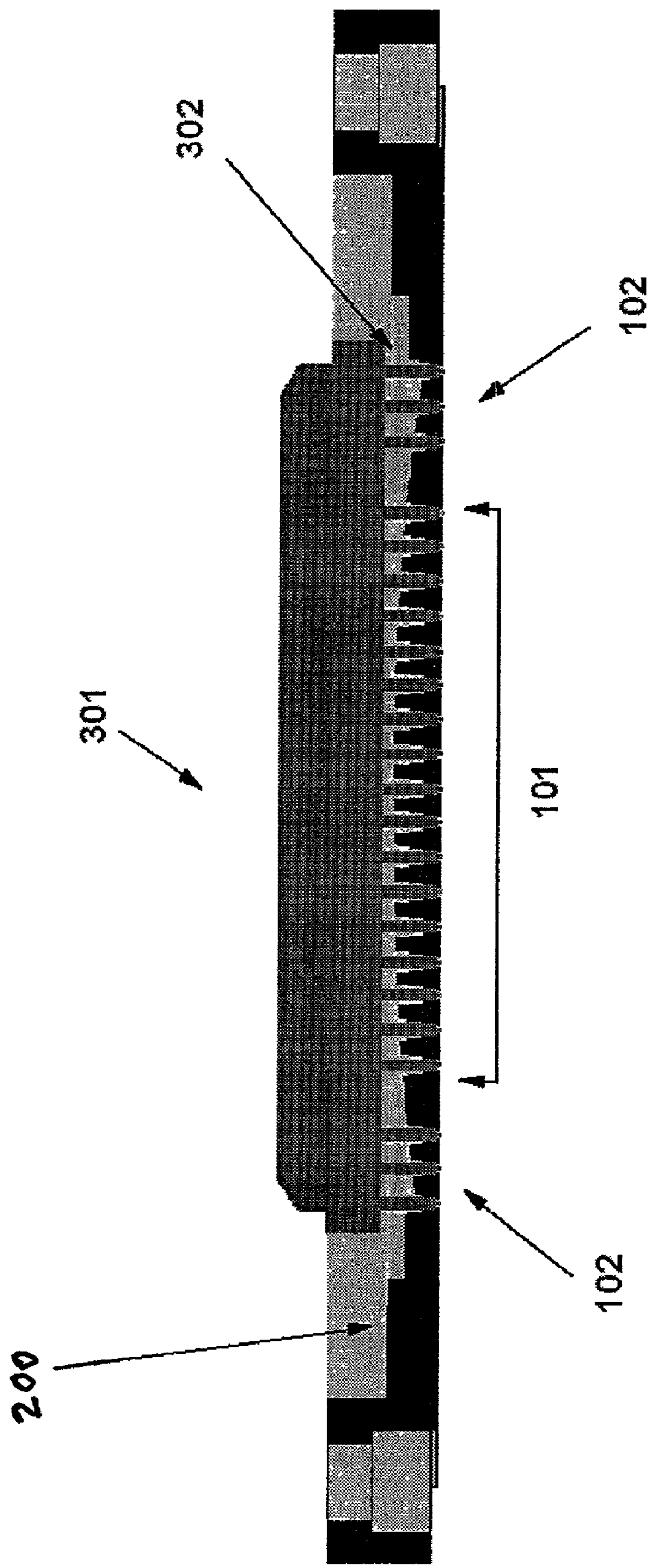
FIG. 7 is a pictorial cross-sectional view of a module and template in a second embodiment according to the present invention showing the columns fully engaged into the holes of the template.

Although the description of the preferred embodiment of the invention has been directed to a template having holes at discrete levels or surfaces, it is understood in a second embodiment of the present invention as shown in FIG. 7 that the top surface openings of the holes could be formed in an arcuate or arc-shaped surface such that the openings towards the outer edges of the template 200 are uniformly lower than the openings toward the central area of the template 200. This configuration would allow the same beneficial results to be achieved as has been previously described and illustrated for discrete levels of hole openings in the template.

Figure 6:
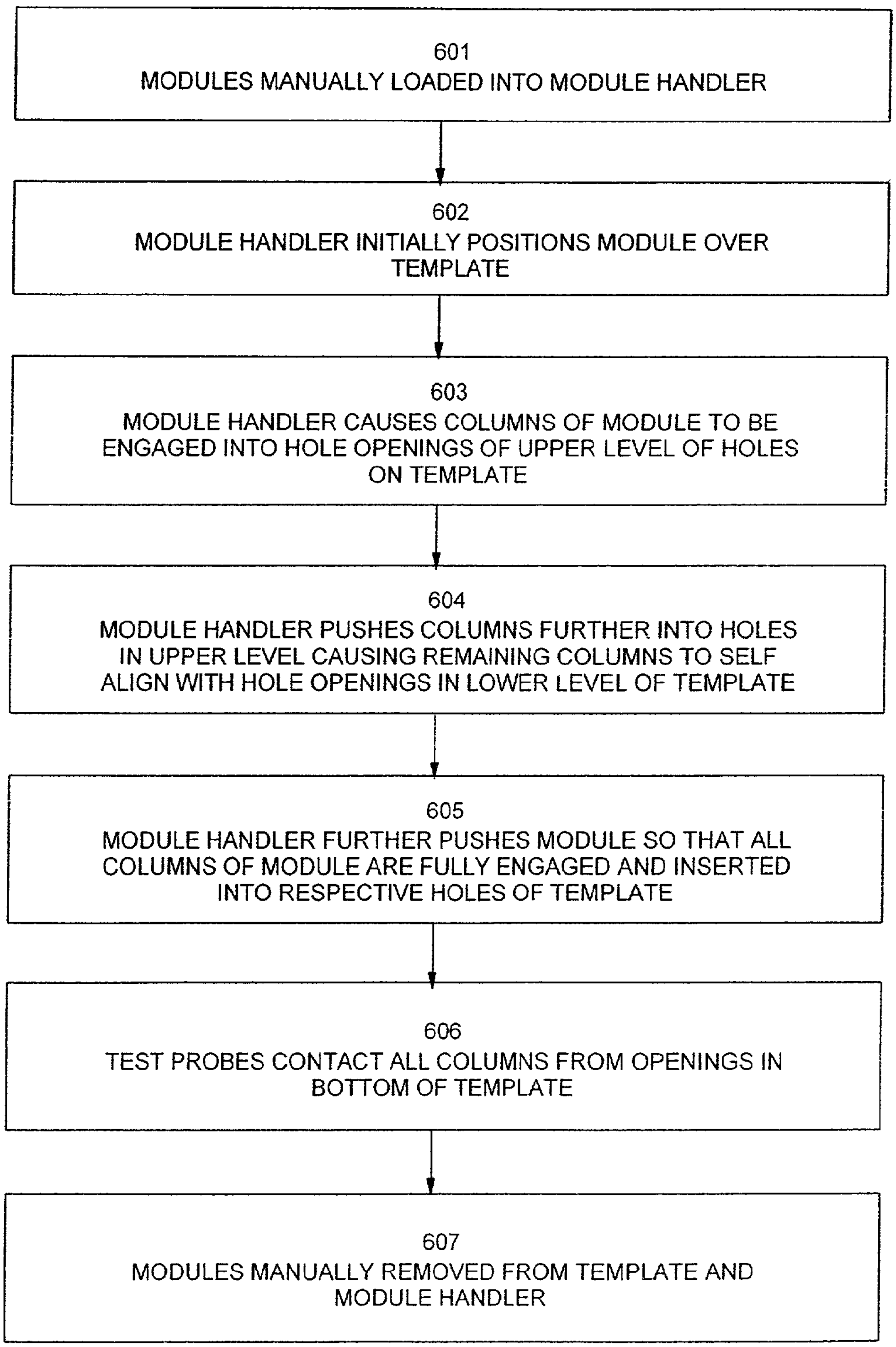
FIG. 6 is a flow chart of the method according to the present invention.

With reference to FIG. 6, a process using the previously described novel template for testing the columns of a contact column grid array module will be described. The contact column grid array modules are manually loaded into the module handler as has been previously described, at step 601. The module handler then moves the modules one at a time towards the location where the template and testing equipment is positioned. At step 602 the automatic module handler properly positions the module and its columns over the holes of the template. At step 603 the automatic module handler causes the central columns of the module to be engaged into the openings of the holes of the upper level or surface of holes of the template. This ensures that the remaining columns of the module will be automatically properly pre-aligned for other holes of the template. At step 604 the automatic module handler pushes the columns further into the holes in the upper level of the template causing the remaining or outside columns of the module to self-align with and enter the corresponding hole openings in the lower level of the template. At step 605 the automatic module handler further pushes the module towards the template so that all of the columns of the module are fully engaged and inserted into the respective holes of the template. In a well known manner, test probes are then caused to contact each of the columns of the column grid array from the openings in the bottom of the template and any required electrical tests are conducted on the columns and the electronic components of the module and the results noted as at step 606. At step 607 the modules are then manually removed from the template and the module handler for further processing or assembly as would be appropriate depending upon the nature of the test results for each particular module.

While the invention has been particularly shown and described with reference to preferred exemplary embodiments thereof, it will be understood by those skilled in the art that variations in form and detail may be made therein without departing from the spirit and scope of the invention as is defined in the following claims.

The embodiments of the invention in which an exclusive property or privilege is claimed are defined as follows:

1. A method for positioning a plurality of interconnecting elements of an array of interconnecting elements of an electronic module into respective holes of a template, said template having a top surface and a bottom surface and having an array of holes extending from the top surface to the bottom surface of at least the same number of holes as the number of interconnecting elements of said array of interconnecting elements and said array of holes being correspondingly positioned as the interconnecting element array, each of said holes having an opening in said top and bottom surfaces, and at least some of said openings in a first portion of the top surface being positioned at greater distances from the bottom surface than other openings in the top surface and at least some of other of said openings in a second portion of the top surface being positioned at a lesser distance from the bottom surface than other openings, said method comprising the steps of:

positioning the module so that the interconnecting elements corresponding to the holes in said first portion of the top surface are aligned wit and are positioned over the holes of said first portion of the top surface;

engaging said interconnecting elements corresponding to the holes in said first portion of the top surface with said holes in said first portion of the top surface so that said interconnecting elements enter the corresponding holes in the first portion of the top surface and other interconnecting elements are aligned with other holes of the template; and urging the module towards the template such that interconnecting elements are pushed into holes in said first portion of the top surface of the template and other interconnecting elements enter and are pushed into holes located in the second portion of the top surface of the template such that each of the interconnecting elements of the module is engaged with and pushed into a corresponding hole in the template.

2. The method for positioning a plurality of interconnecting elements of an array of interconnecting elements of an electronic module into respective holes of a template as defined in claim 1 wherein said steps comprise holding the module, aligning the interconnecting elements with corresponding holes by moving and rotating the electronic module and pushing the electronic module toward the template so tat the interconnecting elements enter and are pushed into the corresponding holes in the template.

3. The method for positioning a plurality of interconnecting elements of an array of interconnecting elements of an electronic module into respective holes of a template as defined in claim 1 further comprising the step, after the step of urging, of contacting each of the interconnecting elements with a test probe in order to electrically test each of the interconnecting elements and the electronic module.

4. The method for positioning a plurality of interconnecting elements of an array of interconnecting elements of an electronic module into respective holes of a template as defined in claim 1 wherein said interconnecting elements are in the form of a plurality of contact columns of an array of contact columns.

5. The method for positioning a plurality of interconnecting elements of an array of interconnecting elements of an electronic module into respective holes of a template as defined in claim 1 wherein said interconnecting elements are in the form of a plurality of contact pins in an array of contact pins.

6. The method for positioning a plurality of interconnecting elements of an array of interconnecting elements of an electronic module into respective holes of a template as defined in claim 1 wherein the top surface comprises first and second surfaces such that said first surface is positioned farther from said bottom surface than said second surface.

7. The method for positioning a plurality of interconnecting elements of an array of interconnecting elements of an electronic module into respective holes of a template as defined in claim 1 wherein the top surface comprises an arcuate surface.

8. A method for positioning a plurality of interconnecting elements of an array of interconnecting elements of an electronic module into respective holes of a template, said method comprising the steps of:

positioning the module so that a first portion of the interconnecting elements are aligned with a first portion of the holes of the template;

engaging the first portion of interconnecting elements with the first portion of holes in the template so that the first portion of interconnecting elements enter the first portion of holes in the template and aligning a second portion of interconnecting elements with a second portion of holes of the template, the second portion of interconnecting elements not being engaged with or entered into the second portion of holes of the template;

urging the module towards the template such that the first portion of interconnecting elements are pushed further into the first portion of holes in the template and engaging the second portion of interconnecting elements with the second portion of holes in the template so that the second portion of interconnecting elements enter the second portion of holes in the template; and further urging the module towards the template until the first and second portions of interconnecting elements are inserted fully into the first and second portions of the holes of the template.

* * * * *